US012625182B2

(12) United States Patent
Tashima et al.

(10) Patent No.: US 12,625,182 B2
(45) Date of Patent: May 12, 2026

(54) MALFUNCTION DETECTION METHOD AND ELECTRONIC CONTROL DEVICE CAPABLE OF DETECTING MALFUNCTION

(71) Applicant: DENSO CORPORATION, Kariya-city (JP)

(72) Inventors: Tsuyoshi Tashima, Kariya-city (JP); Daisuke Kobayashi, Kariya-city (JP); Masaya Taki, Kariya-city (JP); Ryo Kano, Kariya-city (JP); Hisashi Kameya, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 226 days.

(21) Appl. No.: 18/523,731

(22) Filed: Nov. 29, 2023

(65) Prior Publication Data

US 2024/0103080 A1      Mar. 28, 2024

Related U.S. Application Data

(63) Continuation of application No. PCT/JP2022/020063, filed on May 12, 2022.

(30) Foreign Application Priority Data

Jun. 1, 2021    (JP) ................................. 2021-092321

(51) Int. Cl.
*G01R 31/327*       (2006.01)
*B62D 5/04*          (2006.01)
*G01R 19/165*       (2006.01)
(52) U.S. Cl.
CPC ......... *G01R 31/327* (2013.01); *B62D 5/0481* (2013.01); *G01R 19/16576* (2013.01)

(58) Field of Classification Search
CPC ................ G01R 31/327; G01R 19/165; G01R 19/16576; G01R 31/3278; B62D 5/04; B62D 5/0481; B60R 16/02; H02H 7/20
See application file for complete search history.

(56) References Cited

U.S. PATENT DOCUMENTS

| | | |
|---|---|---|
| 2010/0085060 A1 | 4/2010 | Ichikawa |
| 2013/0119782 A1 | 5/2013 | Ichikawa et al. |
| 2020/0108731 A1* | 4/2020 | Matsumoto ............... H02P 3/18 |

FOREIGN PATENT DOCUMENTS

JP          2013-177822 A       9/2013

* cited by examiner

*Primary Examiner* — Son T Le
(74) *Attorney, Agent, or Firm* — Precision Patents, P.C.

(57)          ABSTRACT

A malfunction detection method detects a malfunction in an electronic control device. The electronic control device includes a normal power supply terminal connected to a normal power supply mounted on a vehicle, a starting power supply terminal connected to a starting power supply, a controller activated by supply of a normal voltage, and a wake-up circuit having a wake-up switch to open and close a power supply path from the normal power supply terminal to the controller. The wake-up circuit turns on the wake-up switch when a starting voltage input to the starting power supply terminal is equal to or greater than an ON threshold. The malfunction detection method includes determining by the controller that the wake-up switch has an ON sticking malfunction when the normal voltage is equal to or greater than a threshold and the starting voltage is less than the ON threshold.

13 Claims, 8 Drawing Sheets

VOLTAGE SUPPLY STATE

VOLTAGE NON-SUPPLY STATE

MALFUNCTION DETECTION METHOD AND ELECTRONIC CONTROL DEVICE CAPABLE OF DETECTING MALFUNCTION

CROSS REFERENCE TO RELATED APPLICATIONS

The present application is a continuation application of International Patent Application No. PCT/JP2022/020063 filed on May 12, 2022, which designated the U.S. and claims the benefit of priority from Japanese Patent Application No. 2021-092321 filed on Jun. 1, 2021. The entire disclosures of all of the above applications are incorporated herein by reference.

TECHNICAL FIELD

The present disclosure relates to a malfunction detection method and an electronic control device capable of detecting a malfunction.

BACKGROUND

Conventionally, techniques for detecting a sticking malfunction of a power relay provided in a power supply circuit are known.

SUMMARY

According to at least one embodiment, a malfunction detection method detects a malfunction in an electronic control device. The electronic control device includes a normal power supply terminal connected to a normal power supply mounted on a vehicle, a starting power supply terminal connected to a starting power supply via a starting switch that is turned on when the vehicle is started, a controller which is activated by supply of a normal voltage input from the normal power supply via the normal power supply terminal, and a wake-up circuit having a wake-up switch to open and close a power supply path from the normal power supply terminal to the controller. The wake-up circuit turns on the wake-up switch to open the power supply path when a starting voltage input to the starting power supply terminal is equal to or greater than an ON threshold. The malfunction detection method includes determining by the controller that the wake-up switch has an ON sticking malfunction when the normal voltage is equal to or greater than a threshold and the starting voltage is less than the ON threshold.

BRIEF DESCRIPTION OF DRAWINGS

The details of one or more embodiments are set forth in the accompanying drawings and the description below. Other features and advantages will be apparent from the description and drawings, and from the claims.

The above and other objectives, features and advantages of the present disclosure will become more apparent from the following detailed description with reference to the accompanying drawings. In the drawings.

DETAILED DESCRIPTION

Figure 1:
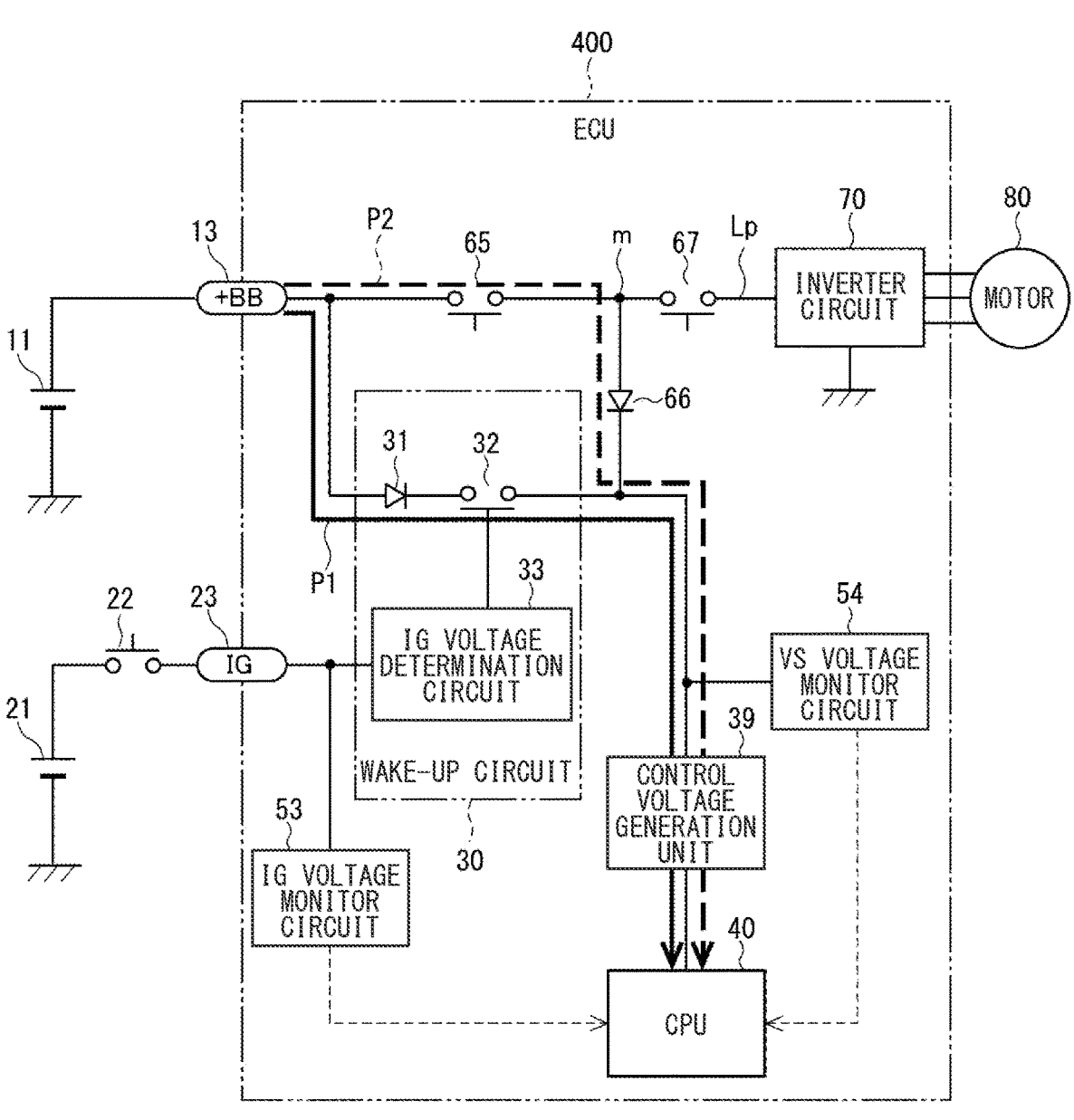
FIG. 1 is a diagram of a system configuration example to which a malfunction detection method of the present embodiment is applied.

To begin with, examples of relevant techniques will be described.

Conventionally, techniques for detecting a sticking malfunction of a power relay provided in a power supply circuit are known. For example, an abnormality diagnosis device disclosed according to a comparative example stores, in a storage unit, information indicating that a power relay has an ON sticking malfunction when a capacitor voltage does not decrease and a microcomputer is capable of operating even though a predetermined time has elapsed after an ignition switch and a power relay are turned off. After that, the microcomputer reads the malfunction information stored in the storage unit and determines that the power relay has an ON sticking malfunction when the ignition switch is turned on again.

In techniques of the comparative example, after a system is temporarily stopped, that is, at the time of restart after a vehicle is parked or stopped, a malfunction is determined based on information stored in the storage unit. Therefore, in a case where the stored information is changed due to some factor while the system is stopped, the microcomputer may read out erroneous information at the time of restart and make an erroneous determination. For example, even if the power relay is actually normal, it will be incorrectly determined that the power relay has failed when the stored information is changed to malfunction information.

In a case where a calculation processing device (i.e., CPU) of the microcomputer is reset as a measure at the time of malfunction determination, operations 1 to 4 of <1> resetting the CPU, <2> restarting the CPU, <3> erroneously determining a malfunction due to garbled stored information, and <4> resetting are repeated. Then, the number of times of memory writing exceeds an upper limit, and the CPU may be damaged.

In contrast to the comparative example, according to a malfunction detection method and an electronic control device, erroneous determination due to changes in stored information can be prevented.

According to one aspect of the present disclosure, a malfunction detection method detects a malfunction in an electronic control device. The electronic control device includes a normal power supply terminal connected to a normal power supply mounted on a vehicle, a starting power supply terminal connected to a starting power supply via a starting switch that is turned on when the vehicle is started, a controller which is activated by supply of a normal voltage input from the normal power supply via the normal power supply terminal, and a wake-up circuit having a wake-up switch to open and close a power supply path from the normal power supply terminal to the controller. The wake-up circuit turns on the wake-up switch to open the power supply path when a starting voltage input to the starting power supply terminal is equal to or greater than an ON threshold. The malfunction detection method includes determining by the controller that the wake-up switch has an ON sticking malfunction when the normal voltage is equal to or greater than a threshold and the starting voltage is less than the ON threshold.

According to this configuration, even in a case where the wake-up switch has the ON sticking malfunction before a system stop, malfunction information is not stored, and the controller detects the malfunction by monitoring the actual voltage at the present time and an operation state of the controller itself. Since malfunction determination is not performed based on stored information, it is possible to prevent erroneous determination due to changes in stored information or the garbled stored contents. Further, when the controller is reset as a measure at the time of the malfunction determination, since repetition of the reset operation due to erroneous determination is prevented, destruction of the controller can be prevented due to the number of times of memory writing exceeding an upper limit.

Embodiment

An embodiment of a malfunction detection method will be described with reference to the drawings. First, referring to FIG. 1, a system configuration example to which the malfunction detection method of the present embodiment is applied will be described. In this system, an electronic control unit (hereinafter, "ECU") 400 drives a motor 80 that outputs a steering assist torque of an electric power steering device using electric power of an auxiliary battery 11 mounted on a vehicle. The ECU is also referred to as an electronic control drives.

The ECU 400 includes an auxiliary battery terminal 13 ("+BB" in the drawing) and an ignition (hereinafter, "IG") terminal 23 as power input terminals. In the system configuration example illustrated in FIG. 1, the auxiliary battery terminal 13 and the IG terminal 23 are connected to different power supplies. The auxiliary battery terminal 13 is connected to the auxiliary battery 11 for 12 Volts, for example. The IG terminal 23 is connected to an IG battery 21 via an IG switch 22. Note that, as in another system configuration example illustrated in FIG. 7, the IG terminal 23 may be commonly connected to the auxiliary battery 11.

The IG switch 22, which is a term of the embodiment, is conceptually a "start switch" that is turned on at the time of starting the vehicle. Correspondingly, the IG battery 21 is a "starting power supply", and the IG terminal 23 is a "starting power supply terminal". An IG voltage, which will be described later as a voltage input to the IG terminal 23, corresponds to a "starting voltage". In this specification, "start" is used for the vehicle, and "activate" is used for a CPU.

The auxiliary battery 11, which is also a term of the embodiment, is conceptually a "regular power supply" that always supplies power during system operation. Correspondingly, the auxiliary battery terminal 13 is a "normal power supply terminal". A VS voltage, which will be described later as a voltage of the auxiliary battery 11 input to the ECU 400 via the auxiliary battery terminal 13, corresponds to the "normal voltage".

The ECU 400 includes a power relay 65, a reverse connection protection relay 67, an inverter circuit 70, and the like as main components of a power system that supplies electric power to the motor 80. The motor 80 is, for example, a three-phase brushless motor. The inverter circuit 70 converts DC power from the auxiliary battery 11 to three-phase AC power and outputs the three-phase AC power when switching elements of an upper and lower three-phase arms operate.

The power relay 65 and the reverse connection protection relay 67 are provided on the power supply line Lp from the auxiliary battery terminal 13 to the inverter circuit 70, and cut off a connection between the auxiliary battery 11 and the inverter circuit 70 at a time of OFF. A downstream terminal (i.e., a cathode) of each parasitic diode is connected to an intermediate point m when the power relay 65 and the reverse connection protection relay 67 are configured with metal oxide semiconductor field effect transistors (MOS-FETs). The intermediate point m is connected to a control voltage generation unit 39 via an intermediate diode 66. In addition, a noise filter, a smoothing capacitor, a current sensor, and the like, which are components of a power system, are omitted.

The ECU 400 includes a wake-up circuit 30, the control voltage generation unit 39, a CPU 40, and the like as components of an activation system and a control system. The control voltage generation unit 39 generates a control voltage of, for example, 5 Volts at maximum from the VS voltage input from the auxiliary battery terminal 13, and outputs the control voltage to the CPU 40. The control voltage generation unit 39 includes, for example, a dedicated custom IC (Integrated Circuit). The CPU 40 is activated by the control voltage supplied from the control voltage generation unit 39, and executes various control calculations to control the operation of the ECU 400.

In the embodiment, strictly speaking, the control voltage generation unit 39 to which the VS voltage is supplied generates the control voltage, and the CPU 40 operates by the control voltage based on the VS voltage. However, conceptually, a function of the control voltage generation unit 39 can be included in a part of the "CPU". Therefore, it may be expressed as "the CPU 40 is activated by the supply of the VS voltage". A "power supply path from the auxiliary battery terminal 13 to the control voltage generation unit 39" may be replaced with a "power supply path from the auxiliary battery terminal 13 to the CPU 40".

The wake-up circuit 30 includes a wake-up diode 31, a wake-up switch 32, and an IG voltage determination circuit 33. The wake-up switch 32 opens and closes the power supply path from the auxiliary battery terminal 13 to the CPU 40. The IG voltage determination circuit 33 determines whether the input IG voltage is equal to or greater than an ON threshold when the IG switch 22 is turned on. The IG voltage determination circuit 33 turns on the wake-up switch 32 when the IG voltage is equal to or greater than the ON threshold. The wake-up switch 32 and the IG voltage determination circuit 33 may be integrated in one IC.

An electric current flows from the auxiliary battery terminal 13 through the wake-up switch 32 and the VS voltage is supplied to the control voltage generation unit 39 when the wake-up switch 32 is turned on, as indicated by the thick solid arrow in FIG. 1. This power supply path is referred to as a "first power supply path P1". The wake-up diode 31 prevents backflow of an electric current in the first power supply path P1.

An electric current flows from the auxiliary battery terminal 13 via the power relay 65 as indicated by a thick dashed arrow in FIG. 1, and the VS voltage is supplied to the control voltage generation unit 39 when the CPU 40 turns on the power relay 65 as described later. This power supply path is referred to as a "second power supply path P2". The intermediate diode 66 prevents backflow of an electric current in the second power supply path P2.

The ECU 400 further includes an IG voltage monitor circuit 53 that monitors the IG voltage and a VS voltage monitor circuit 54 that monitors the VS voltage. The CPU 40 acquires monitor values of the IG voltage monitor circuit 53 and the VS voltage monitor circuit 54, and performs determination in a malfunction detection method. In addition, although not described in detail, for example, a booster circuit may be provided between the wake-up circuit 30 and the control voltage generation unit 39 to compensate for a voltage drop during cranking.

Figure 2:
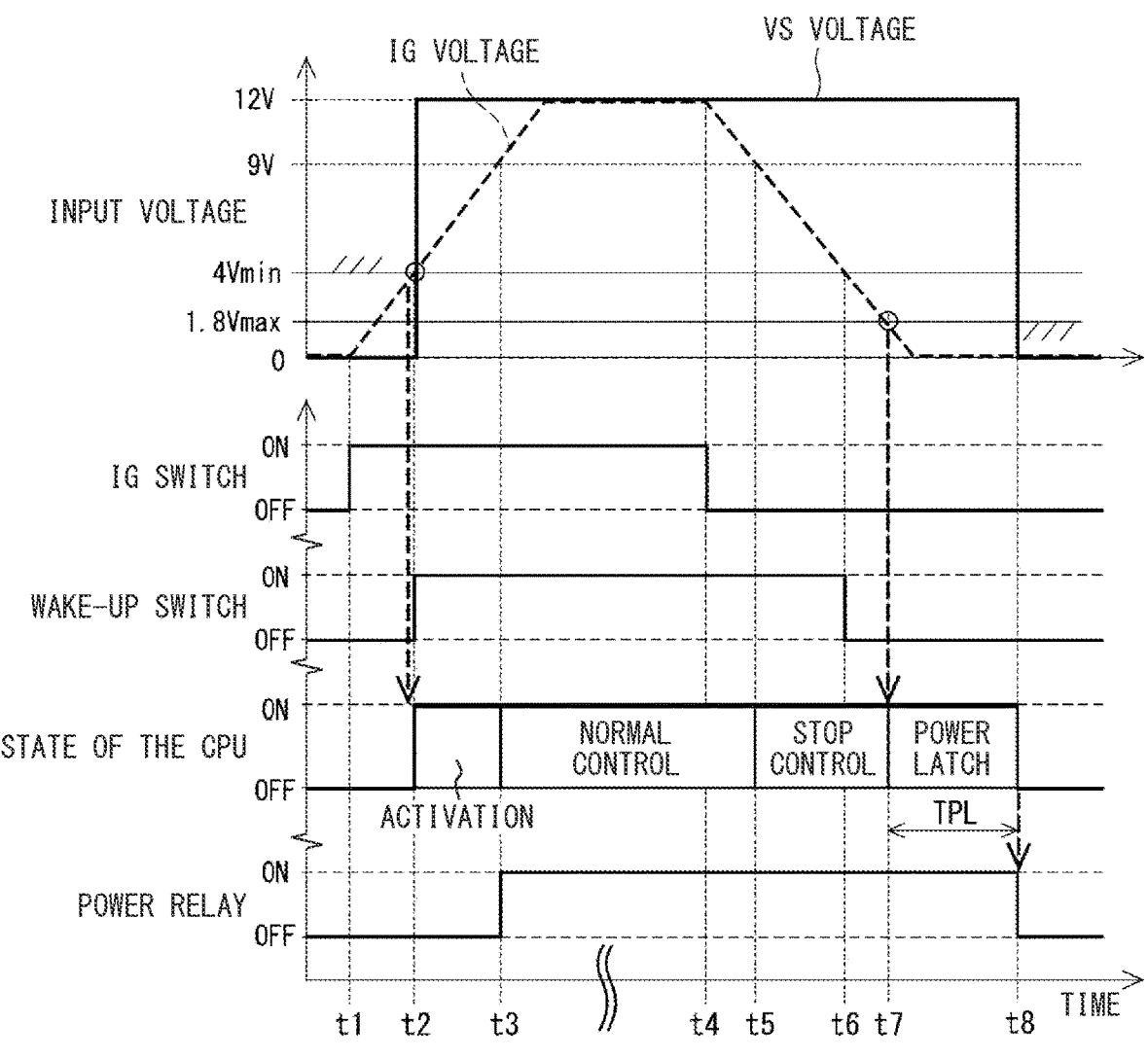
FIG. 2 is a timing chart illustrating an operation of electronic control unit (i.e., ECU) in a normal state.

Next, operation of the ECU 400 in a normal state will be described with reference to a time chart of FIG. 2. An input voltage to the ECU 400, ON/OFF of the IG switch 22, ON/OFF of the wake-up switch 32, a state of the CPU 40, and ON/OFF of the power relay 65 are shown in this order from a top part of FIG. 2. The reverse connection protection relay 67 is turned on and off simultaneously with the power relay 65, but will not be described below.

An example of a voltage value as an input voltage is shown. A maximum value of the IG voltage and the VS voltage is 12 Volts, and normal control of the CPU 40 is possible when the IG voltage is 9 Volts or more. The normal control of the present embodiment means that an assist of the electric power steering device is being executed. A minimum IG voltage at which the CPU 40 can be activated is 4 Volts. A maximum IG voltage at which the CPU 40 shifts from stop control to a power latch based on the IG voltage monitored by the IG voltage monitor circuit 53 when the IG voltage decreases is 1.8 Volts.

At a time of starting, the IG switch 22 is turned on at time t1, and the IG voltage supplied to the IG terminal 23 gradually increases. The IG voltage determination circuit 33 turns on the wake-up switch 32 when the IG voltage reaches 4 Volts at time t2. Then, the VS voltage of 12 Volts is supplied from the auxiliary battery terminal 13 to the control voltage generation unit 39 through the first power supply path P1, and the CPU 40 is activated.

The CPU 40 turns on the power relay 65 and starts normal control of the ECU 400 when the IG voltage monitor value reaches 9 Volts at time t3. After a start of the normal control, the VS voltage is supplied to the control voltage generation unit 39 through the second power supply path P2 in addition to the first power supply path P1.

During the stop, the IG switch 22 is turned off at time t4, and the IG voltage starts to decrease. The CPU 40 shifts from the normal control to the stop control when the IG voltage monitor value decreases to 9 Volts at time t5. The IG voltage determination circuit 33 turns off the wake-up switch 32 when the IG voltage drops to 4 Volts at time t6. At this time, although the first power supply path P1 is cut off, the supply of the VS voltage to the control voltage generation unit 39 through the second power supply path P2 is continued.

The CPU 40 shifts from the stop control to the power latch when the IG voltage monitor value decreases to 1.8 Volts at time t7. During the power latch, the VS voltage is held for a predetermined period TPL (for example, 10 minutes) in order to maintain some functions of the CPU 40. At time t8 when the predetermined period TPL has elapsed from time t7, the power latch ends, the CPU 40 turns off the power relay 65, and the supply of the VS voltage from the second power supply path P2 to the control voltage generation unit 39 is cut off. Therefore, the CPU 40 stops the operation.

On the premise of the system configuration as described above, in the present embodiment, it is assumed that the wake-up switch 32 has an ON sticking malfunction. In the conventional technique disclosed in Patent Literature 1, a malfunction is determined based on stored contents of a storage unit, and thus there is a possibility that an erroneous determination is made when the stored content is garbled. Even if the wake-up switch 32 is actually normal, it is erroneously determined that a malfunction has occurred when the stored contents are changed to malfunction contents. Conversely, even if the wake-up switch 32 actually fails, if the stored contents are changed to the normal contents, it is erroneously determined to be normal.

In a case where the CPU 40 is reset as a measure at the time of malfunction determination, operations 1 to 4 of <1> resetting the CPU 40, <2> restarting the CPU 40, <3> erroneously determining a malfunction due to garbled stored information, and <4> resetting are repeated. Then, the number of times of memory writing exceeds an upper limit, and the CPU 40 may be damaged. In order to avoid such an issue, an object of the present embodiment is to detect an ON sticking malfunction of the wake-up switch 32 by a method other than the malfunction determination based on the stored contents.

Next, with reference to FIGS. 3 to 5, behavior of the wake-up circuit 30 and a malfunction detection method when the wake-up switch 32 has the ON sticking malfunction will be described. In the time chart of FIG. 3, the times t4 to t8 correspond to the times indicated by the same symbols shown in FIG. 2. A vertical axis represents, in order from a top part of FIG. 3, the auxiliary battery terminal voltage, ON/OFF of the IG switch 22, the IG voltage, the VS voltage at the time of malfunction and at the time of normal, the CPU state, and ON/OFF of the power relay 65.

A binary value of HI or LO represents each voltage. HI corresponds to 9 Volts to 12 Volts in FIG. 2. For the VS voltage after time t10, a voltage equal to or higher than the determination threshold is treated as HI. LO of the auxiliary battery terminal voltage and the VS voltage substantially corresponds to 0 Volts. LO of the IG voltage means that it is less than the ON threshold of the wake-up switch 32, and corresponds to less than 4 Volts in FIG. 2.

Figure 3:
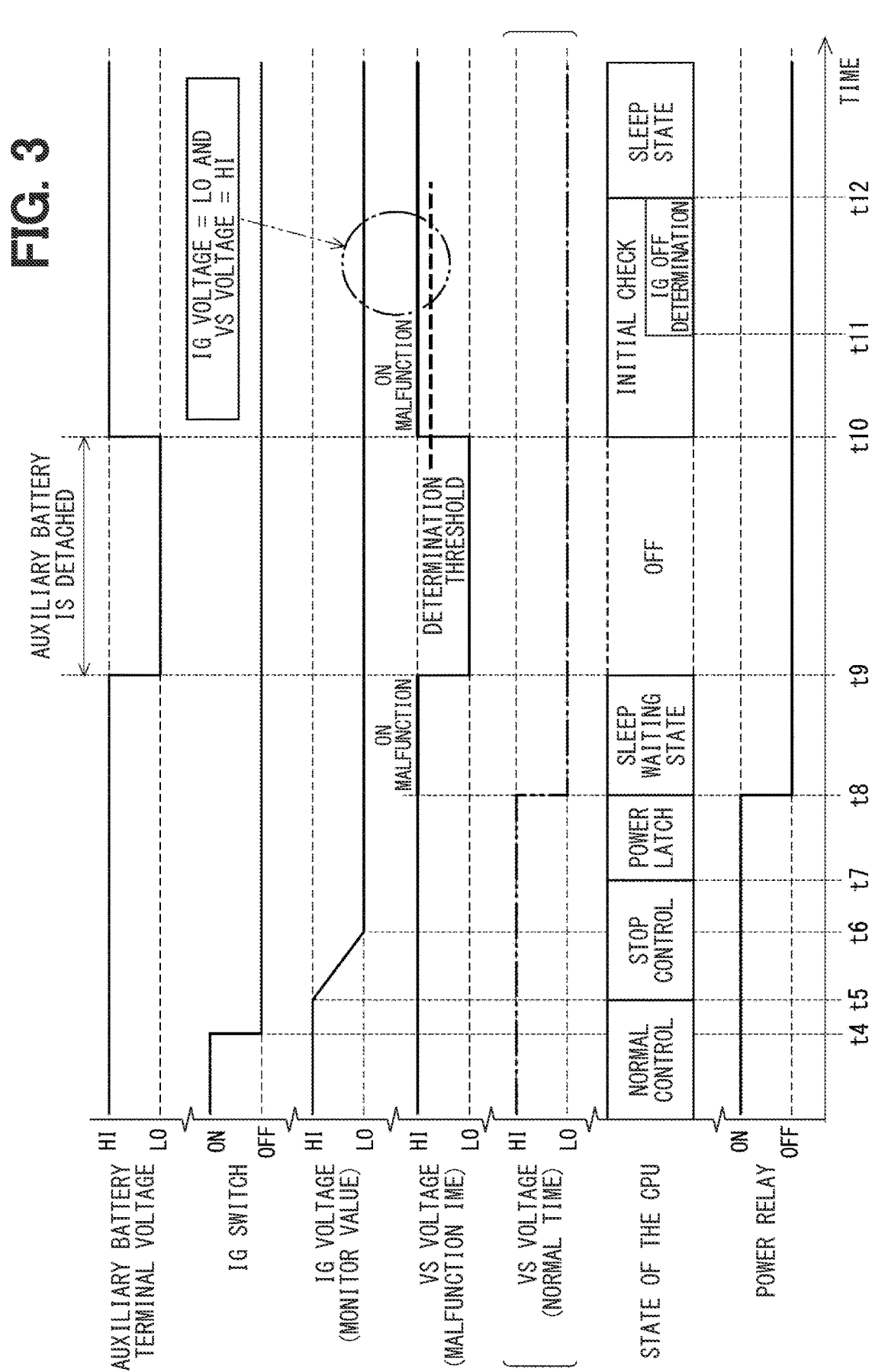
FIG. 3 is a time chart illustrating the malfunction detection method of the present embodiment.
Figure 4:
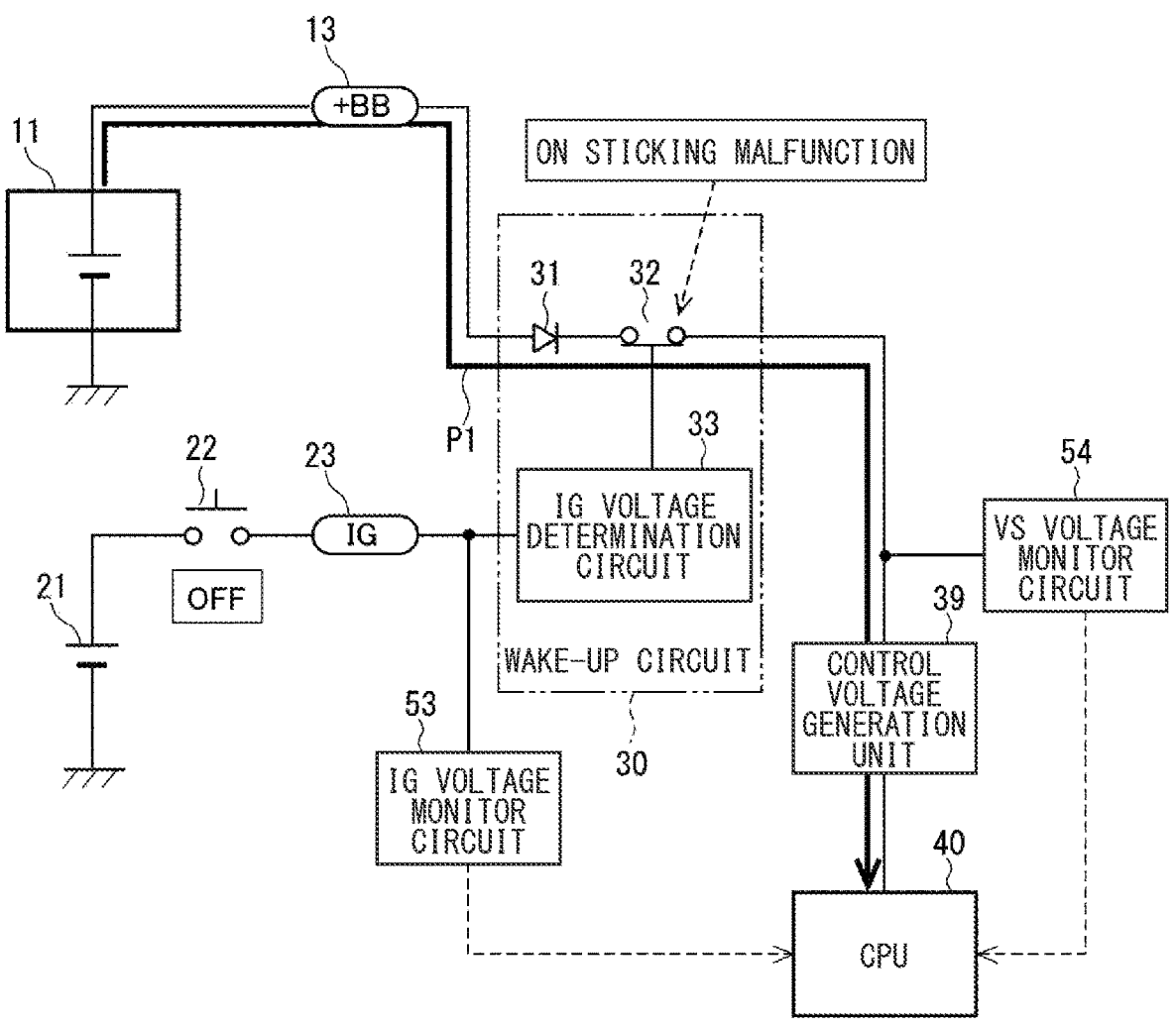
FIG. 4 is a diagram illustrating a voltage supply state after an ignition switch is turned off before the auxiliary battery is detached and after the auxiliary battery is reattached.
Figure 5:
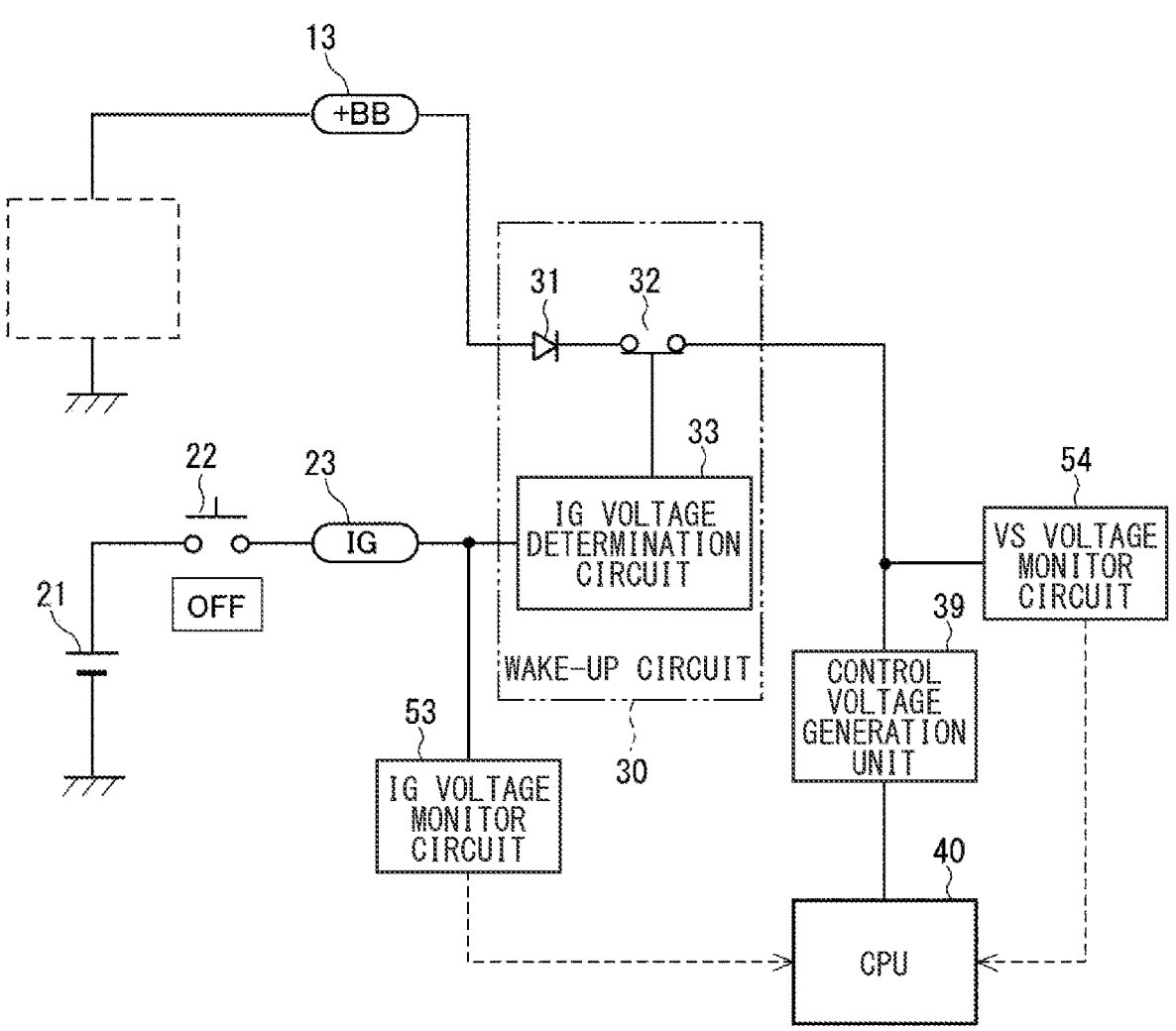
FIG. 5 is a diagram illustrating a voltage non-supply state during detaching of the auxiliary battery.

FIG. 4 shows a voltage supply state from time t4 to time t9 and after time t10 in FIG. 3. FIG. 5 shows a voltage non-supply state from time t9 to time t10 in FIG. 3. In contrast to the configuration of the ECU 400 shown in FIG. 1, components not directly related to the malfunction detection method are not shown in FIGS. 4 and 5.

At time t4, the IG switch 22 is turned off, and at time t5, the control shifts to the stop control. From time t5 to time t6, the IG voltage decreases from HI to LO. The power latch is performed between times t7 and t8. As shown in FIG. 2, in the normal state, the wake-up switch 32 is turned off by the IG voltage determination circuit 33 at time t6 during the stop control, and the first power supply path P1 is cut off. At time t8 at which the power latch ends, the supply of the VS voltage is cut off, and the operation of the CPU 40 is stopped.

However, when the wake-up switch 32 has the ON sticking malfunction, as shown in FIG. 4, the VS voltage continues to be supplied to the control voltage generation unit 39 via the first power supply path P1 even after time t6. Therefore, after the time t8 at which the power latch ends, the CPU 40 enters a "sleep waiting state" without being able to stop. In the conventional technique of Patent Literature 1, the ON sticking malfunction is detected at this timing, and the malfunction information is stored in the storage unit.

At time t9, the auxiliary battery 11 is removed. As shown in FIG. 5, since a connection between the auxiliary battery 11 and the auxiliary battery terminal 13 is cut off, the VS voltage is not supplied from the auxiliary battery terminal 13 to the control voltage generation unit 39 even when the wake-up switch 32 has the ON sticking malfunction. Therefore, the CPU 40 stops.

At time t10, the auxiliary battery 11 is reattached. Here, the detachment and the reattachment of the auxiliary battery 11 are not limited to the detachment accompanied by the replacement of the auxiliary battery 11, and may be performed only by temporarily detaching a cable from the same auxiliary battery and then reattaching the same auxiliary battery. In another system configuration example shown in FIG. 8, a battery cutoff switch 12 provided between the auxiliary battery 11 and the auxiliary battery terminal 13 path may be temporarily turned off and then turned on.

By reattaching the auxiliary battery 11, the connection between the auxiliary battery 11 and the auxiliary battery terminal 13 is switched from a disconnected state to a connected state. However, since the IG switch 22 remains OFF, in a normal state, the IG voltage is not supplied to the IG terminal 23, and the wake-up switch 32 is not turned ON. Therefore, the VS voltage is not supplied to the control voltage generation unit 39.

However, a voltage is supplied to the control voltage generation unit 39 through the first power supply path P1 when the wake-up switch 32 has the ON sticking malfunction, and the CPU 40 is activated. The CPU 40 sequentially performs items of an initial check after activation. At time t11 during the initial check, the CPU 40 performs OFF determination of the IG switch 22, that is, LO determination of the IG voltage.

As described above, when the connection between the auxiliary battery 11 and the auxiliary battery terminal 13 is switched from the disconnected state to the connected state and the CPU 40 is activated, the CPU 40 monitors the IG voltage and the VS voltage. Then, in a case where the VS voltage is in a HI state equal to or higher than the determination threshold value even though the IG voltage is in the LO state less than the ON threshold value, the CPU 40 determines that the wake-up switch 32 has the ON sticking malfunction.

Incidentally, a detection state of "The IG voltage is LO and the VS voltage is HI." may occur in cases other than the case of a malfunction in which a contact of the wake-up switch 32 is actually welded. For example, due to a HI sticking malfunction of the IG voltage determination circuit 33, the IG voltage determination circuit 33 may erroneously determine that "the IG voltage is equal to or greater than the ON threshold" even though the IG voltage is actually less than the ON threshold. In this case, the wake-up switch 32 is turned on by a command of the IG voltage determination circuit 33, and the VS voltage is supplied. On the other hand, since a monitor value of the IG voltage monitor circuit 53 is in the LO state, the CPU 40 determines that a malfunction has occurred.

Therefore, in the present embodiment, a case of the HI sticking malfunction of the IG voltage determination circuit 33 or the like is broadly interpreted as being included in the "ON sticking malfunction of the wake-up switch 32". That is, the CPU 40 detects the "ON sticking malfunction of the wake-up switch 32" including the HI sticking malfunction of the IG voltage determination circuit 33 and the like as well as a contact welding malfunction of the wake-up switch 32 by the malfunction detection method described above. If the power relay 65 is stuck on, a detection state is "the IG voltage is LO and the VS voltage is HI." However, this is not assumed to be realistic because the sticking of the power relay 65 is detected at a next stage to the initial check.

Figure 6:
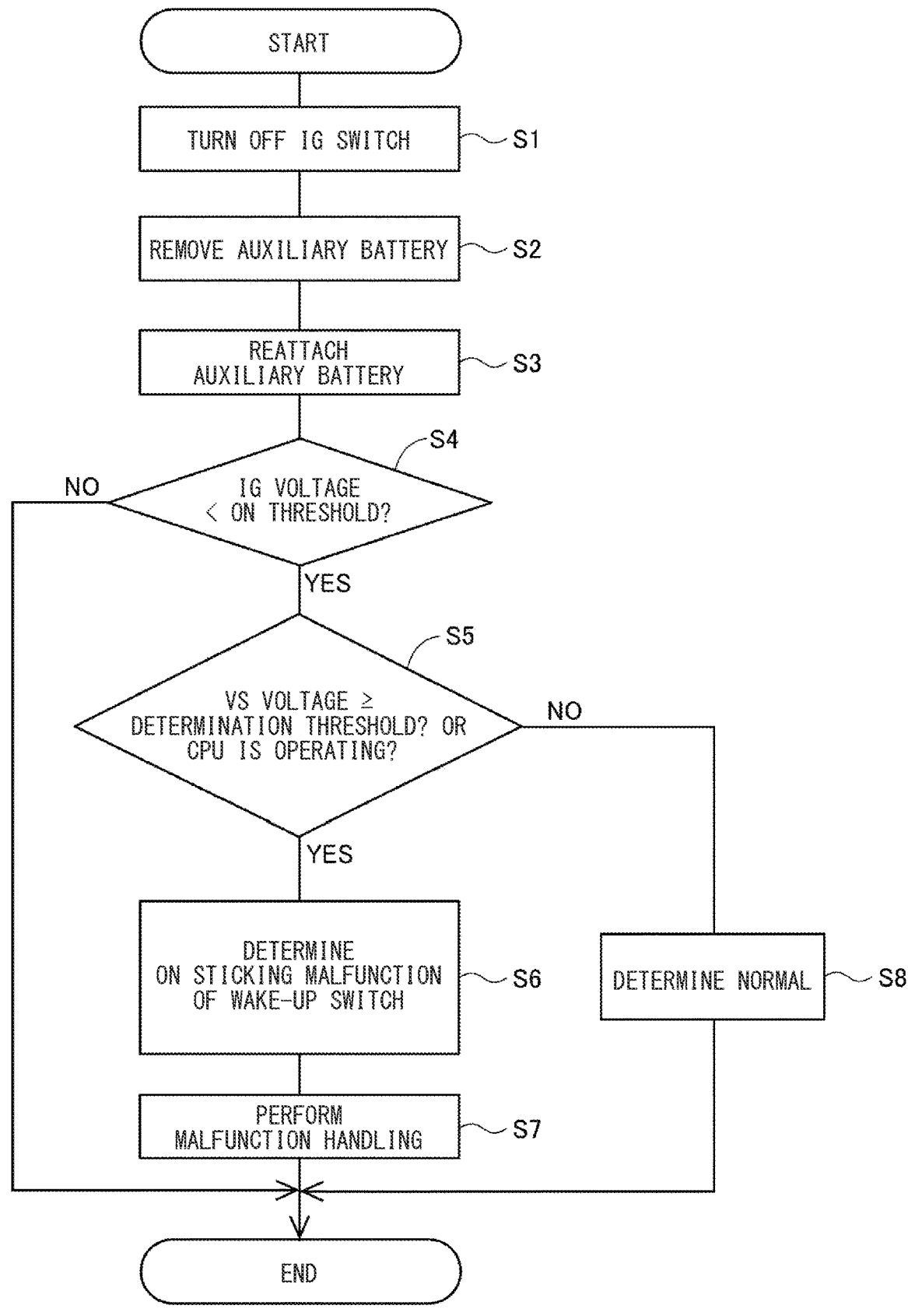
FIG. 6 is a flowchart illustrating the malfunction detection method of the present embodiment.

A flowchart of FIG. 6 shows a basic flow of the malfunction detection method corresponding to FIG. 3. In the flowchart, a symbol S indicates a step. In step S1, the IG switch 22 is turned off in the normal control. In step S2, the auxiliary battery 11 is removed. In step S3, the auxiliary battery 11 is reattached.

In step S4 during the initial check, the CPU 40 determines whether the IG voltage is less than the ON threshold. When the IG voltage is equal to or higher than the ON threshold and NO is determined in S4, a premise of the malfunction detection method is not satisfied, and thus the processing is ended. In this case, for example, a process may proceed to a process of determining an ON sticking malfunction of the IG switch 22 or a malfunction of the IG voltage monitor circuit 53.

The process proceeds to step S5 when the IG voltage is less than the ON threshold and YES is determined in step S4. In step S5, the CPU 40 determines whether the VS voltage is equal to or higher than a determination threshold or whether the CPU 40 is operating. If YES in step S5, the CPU 40 determines in step S6 that the ON sticking malfunction of the wake-up switch 32 has occurred. Further, in step S7, the CPU 40 shifts to, for example, a sleep state as a malfunction handling. On the other hand, in as case of NO in step S5, the CPU 40 determines in step S8 that it is normal.

In the present embodiment, even in a case where the wake-up switch 32 has the ON sticking malfunction before a system stop, malfunction information is not stored, and the CPU 40 detects the malfunction by monitoring the actual voltage at the present time and an operation state of the CPU 40 itself. Since malfunction determination is not performed based on stored information, it is possible to prevent erroneous determination due to changes in stored information or the garbled stored contents. Further, when the CPU 40 is reset as a measure at the time of the malfunction determination, since repetition of the reset operation due to erroneous determination is prevented, destruction of the CPU 40 can be prevented due to the number of times of memory writing exceeding an upper limit.

Modifications

Modifications of the malfunction detection method of the above embodiments will be described. Logic of the malfunction detection method is to determine the ON sticking malfunction of the wake-up switch 32 in a case of "The IG voltage is LO (that is, less than the ON threshold), and the VS voltage is HI (that is, equal to or greater than the determination threshold)." A timing at which this determination logic is executed is not limited to when the CPU 40 is activated immediately after the auxiliary battery 11 is attached or detached, and may be executed at all times. That is, the CPU 40 always monitors the IG voltage and the VS voltage. Then, in a case where the IG voltage is lowered to the LO state and the VS voltage is maintained in the HI state due to some factor, the CPU 40 may determine that the ON sticking malfunction of the wake-up switch 32 has occurred.

Further, the VS voltage being HI is substantially synonymous with the CPU 40 operating. Therefore, the CPU 40 may set a condition that "the CPU 40 is operating" instead of the condition that "the VS voltage is HI". That is, in a case where the CPU is operating even though the IG voltage is less than the ON threshold value, the CPU 40 may determine that the wake-up switch 32 has the ON sticking malfunction.

Other System Configuration Example

Figure 7:
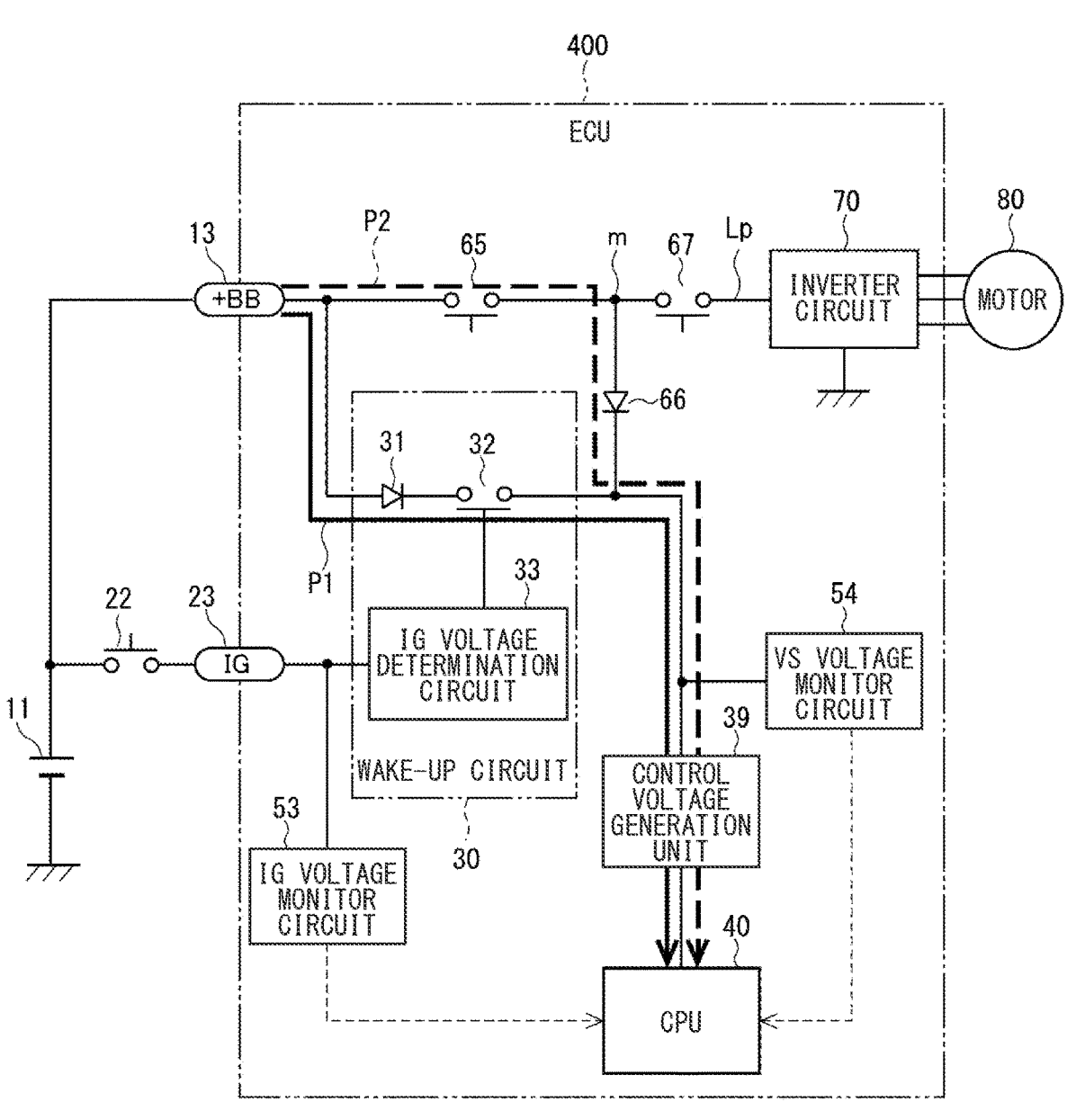
FIG. 7 is a diagram of another system configuration example to which the malfunction detection method of the present embodiment is applied.
Figure 8:
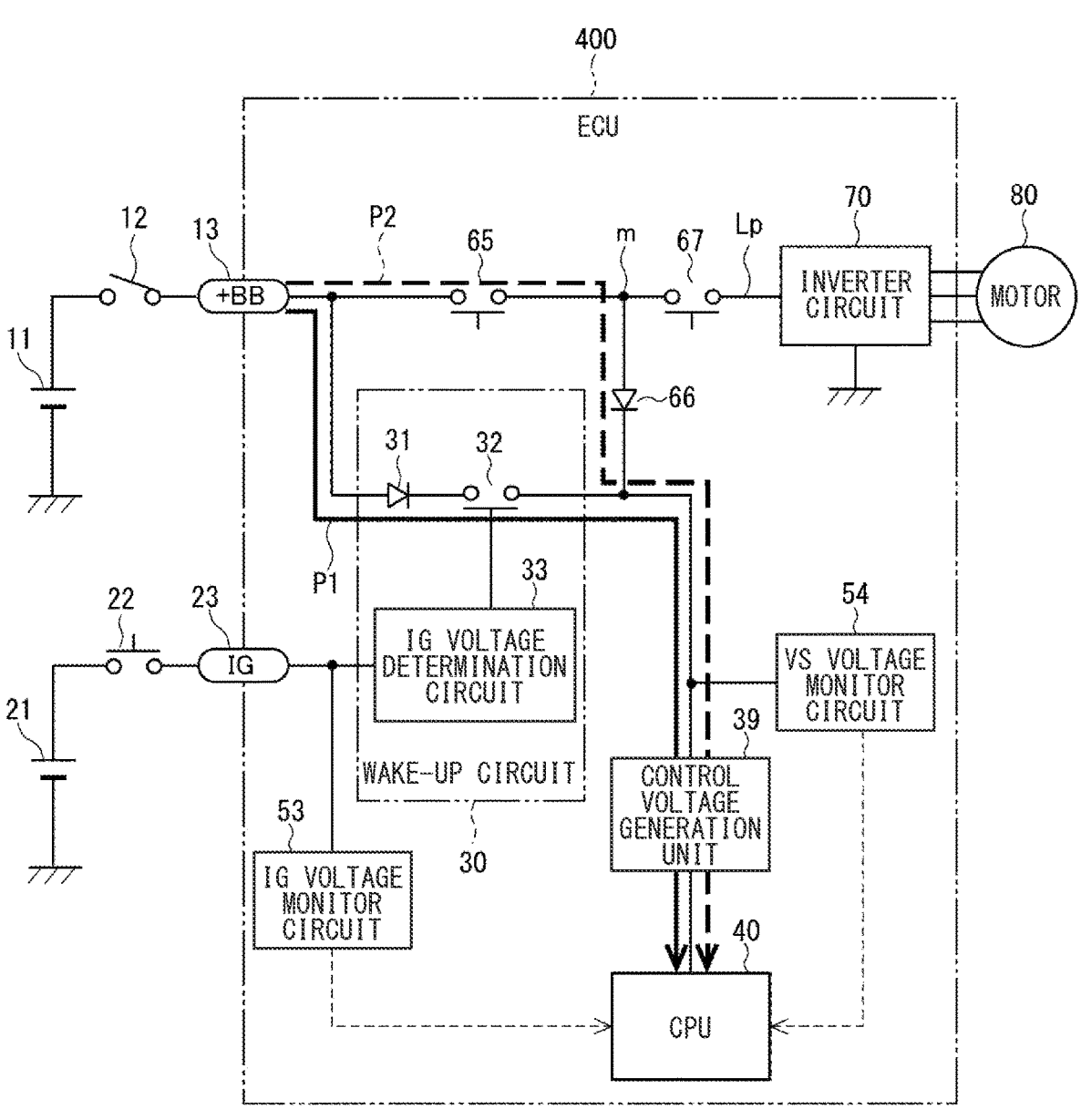
FIG. 8 is a diagram of another system configuration example to which the malfunction detection method of the present embodiment is applied.

FIGS. 7 and 8 show a system configuration example different from FIG. 1 to which the malfunction detection method of the present embodiment is applied. In the system configuration example shown in FIG. 7, an auxiliary battery 11 and an IG battery 21 are not provided separately, but an IG switch 22 is commonly connected to the auxiliary battery 11. That is, the auxiliary battery 11 as the "normal power supply" also functions as the IG battery as the "starting power supply". In this configuration, a similar malfunction detection method can be performed.

In the system configuration example shown in FIG. 8, a battery cutoff switch 12 is provided in a middle of a path connecting the auxiliary battery 11 and the auxiliary battery terminal 13. The battery cutoff switch 12 is operated by a control circuit separate from the CPU 40 or manually by an operator. Instead of attaching and detaching the auxiliary battery 11 in step S2 and step S3 of FIG. 6, the battery cutoff switch 12 may be turned on after being turned off once. This facilitates a work at the time of malfunction detection.

A "service power supply" and a "starting power supply" are not limited to a battery, and may be configured by a capacitor or a fuel cell. Further, instead of power of a DC power supply, power obtained by rectifying an output of an AC power supply may be input to the auxiliary battery terminal 13 and the IG terminal 23.

In contrast to the IG switch 22 in an engine vehicle, in a hybrid vehicle or an electric vehicle, a ready switch corresponds to a "start switch that is turned on when the vehicle is started". In addition to key operation and button operation by a driver, a start command by a control circuit is interpreted as an "ON operation" in ab automated driving vehicle.

An "electronic control device" is not limited to a device that drives an assist motor of the electric power steering device, and may be any device as long as a CPU is activated by voltage supply from a power source mounted on a vehicle and performs various controls.

The present disclosure is not limited to such embodiments but can be implemented in various forms without deviating from the spirit of the present disclosure.

The control device and method described in the present disclosure may be implemented by a special purpose computer which is configured with a memory and a processor programmed to execute one or more particular functions embodied in computer programs of the memory. Alternatively, the control device described in the present disclosure and the method thereof may be realized by a dedicated computer configured as a processor with one or more dedicated hardware logic circuits. Alternatively, the control device and method described in the present disclosure may be realized by one or more dedicated computer, which is configured as a combination of a processor and a memory, which are programmed to perform one or more functions, and a processor which is configured with one or more hardware logic circuits. A computer program may be stored in a computer-readable non-transitory tangible recording medium as an instruction executed by a computer.

While the present disclosure has been described with reference to embodiments thereof, it is to be understood that the disclosure is not limited to the embodiments and constructions. To the contrary, the present disclosure is intended to cover various modification and equivalent arrangements.

In addition, while the various elements are shown in various combinations and configurations, which are exemplary, other combinations and configurations, including more, less or only a single element, are also within the spirit and scope of the present disclosure.

What is claimed is:

1. A malfunction detection method for detecting a malfunction in an electronic control device including
   a normal power supply terminal connected to a normal power supply mounted on a vehicle,
   a starting power supply terminal connected to a starting power supply via a starting switch that is turned on when the vehicle is started,
   a controller which is activated by a supply of a normal voltage that is input from the normal power supply via the normal power supply terminal, and
   a wake-up circuit having a wake-up switch configured to open and close a power supply path from the normal power supply terminal to the controller,
   the wake-up circuit being configured to turn on the wake-up switch to open the power supply path when a starting voltage that is input to the starting power supply terminal is equal to or greater than an ON threshold, the ON threshold indicating a state of the starting voltage between the starting power supply and the controller, the malfunction detection method comprising
      determining by the controller that the wake-up switch has an ON sticking malfunction when the normal voltage is equal to or greater than a determination threshold and the starting voltage is less than the ON threshold, the determination threshold indicating a state of the normal voltage between the normal power supply and the controller.

2. The malfunction detection method according to claim 1, wherein
   the determining by the controller is performed when the controller is activated by switching of a state of connection between the normal power supply and the normal power supply terminal is switched from a disconnected state to a connected state.

3. The malfunction detection method according to claim 1, wherein
   the wake-up switch being provided inside the electronic control device with respect to the starting power supply terminal.

4. The malfunction detection method according to claim 1, wherein
   the wake-up circuit is provided inside an IC.

5. The malfunction detection method according to claim 1, wherein
   the wake-up circuit includes the wake-up switch and a determination circuit configured to determine whether the starting voltage is equal to or greater than the ON threshold when the starting switch is turned on, and
   the wake-up switch and the determination circuit are provided inside an IC.

6. A malfunction detection method for detecting a malfunction in an electronic control device including
   a normal power supply terminal connected to a normal power supply mounted on a vehicle,
   a starting power supply terminal connected to a starting power supply via a starting switch that is turned on when the vehicle is started,
   a controller which is activated by a supply of a normal voltage that is input from the normal power supply via the normal power supply terminal, and a wake-up circuit having a wake-up switch configured to open and close a power supply path from the normal power supply terminal to the controller, the wake-up circuit being configured to turn on the wake-up switch to open the power supply path when a starting voltage that is input to the starting power supply terminal is equal to or greater than an ON threshold, the ON threshold indicating a state of the starting voltage between the starting power supply and the controller, the malfunction detection method comprising determining by the controller that the wake-up switch has an ON sticking malfunction when the controller is operating and the starting voltage is less than the ON threshold.

7. The malfunction detection method according to claim 6, wherein the wake-up switch being provided inside the electronic control device with respect to the starting power supply terminal.

8. The malfunction detection method according to claim 6, wherein the wake-up circuit is provided inside an IC.

9. The malfunction detection method according to claim 6, wherein the wake-up circuit includes the wake-up switch and a determination circuit configured to determine whether the starting voltage is equal to or greater than the ON threshold when the starting switch is turned on, and the wake-up switch and the determination circuit are provided inside an IC.

10. An electronic control device capable of detecting a malfunction, the electronic control device comprising:

a normal power supply terminal connected to a normal power supply mounted on a vehicle;

a starting power supply terminal connected to a starting power supply via a starting switch that is turned on when the vehicle is started;

a controller which is activated by a supply of a normal voltage that is input from the normal power supply via the normal power supply terminal; and a wake-up circuit having a wake-up switch configured to open and close a power supply path from the normal power supply terminal to the controller, wherein the wake-up circuit is configured to turn on the wake-up switch to open the power supply path when a starting voltage that is input to the starting power supply terminal is equal to or greater than an ON threshold, the ON threshold indicating a state of the starting voltage between the starting power supply and the controller, the controller is configured to determine that the wake-up switch has an ON sticking malfunction when the normal voltage is equal to or greater than a determination threshold and the starting voltage is less than the ON threshold or when the controller is operating and the starting voltage is less than the ON threshold, the determination threshold indicating a state of the normal voltage between the normal power supply and the controller.

11. The electronic control device according to claim 10, wherein the wake-up switch being provided inside the electronic control device with respect to the starting power supply terminal.

12. The electronic control device according to claim 10, wherein the wake-up circuit is provided inside an IC.

13. The electronic control device according to claim 10, wherein the wake-up circuit includes the wake-up switch and a determination circuit configured to determine whether the starting voltage is equal to or greater than the ON threshold when the starting switch is turned on, and the wake-up switch and the determination circuit are provided inside an IC.

* * * * *